United States Patent
Fuller

(10) Patent No.: US 11,507,454 B2
(45) Date of Patent: Nov. 22, 2022

(54) IDENTIFYING NON-CORRECTABLE ERRORS USING ERROR PATTERN ANALYSIS

(71) Applicant: Oracle International Corporation, Redwood Shores, CA (US)

(72) Inventor: Benjamin John Fuller, Concord, MA (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 17/080,126

(22) Filed: Oct. 26, 2020

(65) Prior Publication Data

US 2022/0129347 A1     Apr. 28, 2022

(51) Int. Cl.
G06F 11/10     (2006.01)

(52) U.S. Cl.
CPC ................ *G06F 11/1068* (2013.01)

(58) Field of Classification Search
CPC .................................................. G06F 11/1068
See application file for complete search history.

(56) References Cited

U.S. PATENT DOCUMENTS

| | | | |
|---|---|---|---|
| 7,669,189 B1* | 2/2010 | Umamageswaran | G06F 11/3471 714/763 |
| 2004/0088645 A1* | 5/2004 | Ashkhmin | H03M 13/613 714/777 |
| 2005/0289440 A1* | 12/2005 | Neri | G06F 11/1012 714/763 |
| 2009/0164872 A1 | 6/2009 | Chessin et al. | |
| 2012/0072786 A1 | 3/2012 | Bahali et al. | |
| 2014/0139942 A1* | 5/2014 | Grobis | G11B 20/1833 360/51 |
| 2014/0157054 A1* | 6/2014 | Yoon | G06F 11/0751 714/33 |
| 2015/0193302 A1* | 7/2015 | Hyun | G11C 29/028 714/764 |

(Continued)

OTHER PUBLICATIONS

Costa C.H.A. et al., "A System Software Approach to Proactive Memory-Error Avoidance," Proceedings of the International Conference for High Performance Computing, Networking, Storage and Analysis, 2014, pp. 707-718.

(Continued)

*Primary Examiner* — Guy J Lamarre
(74) *Attorney, Agent, or Firm* — Invoke

(57) ABSTRACT

Techniques are described for identifying patterns of memory cells in a memory array that are predictive of non-correctable errors ("corruption patterns"). The techniques described herein identify patterns of cell errors that are likely to generate errors that cannot be corrected by an error correction code (ECC). The identification of non-correctable cells is accomplished by identifying a pattern of cell errors storing bit values that deviate from corresponding expected values. The pattern of these memory cells and various combinations of the cells in the pattern are compared to patterns of cells that are known to be correctable using ECC. If the error pattern or one or more of the combinations of erroneous cells in the pattern are not associated with patterns that are correctable via ECC, the error pattern is identified as predictive of a likely uncorrectable error.

25 Claims, 10 Drawing Sheets

(56) References Cited

U.S. PATENT DOCUMENTS

| | | | |
|---|---|---|---|
| 2016/0155514 A1* | 6/2016 | Lai | G11C 29/4401 |
| | | | 714/723 |
| 2016/0328285 A1* | 11/2016 | Healy | G06F 11/1072 |
| 2016/0328290 A1 | 11/2016 | Healy et al. | |
| 2017/0123879 A1 | 5/2017 | Donlin | |
| 2018/0278273 A1* | 9/2018 | Kifune | H03M 13/2948 |
| 2019/0074067 A1* | 3/2019 | Yang | G11C 16/3427 |
| 2019/0278655 A1 | 9/2019 | Koudele et al. | |
| 2020/0119754 A1* | 4/2020 | Kim | H03M 13/618 |
| 2021/0044393 A1* | 2/2021 | Chung | H04L 1/24 |

OTHER PUBLICATIONS

Polamuri S., Five Most Popular Similarity Measures Implementation in Python., Apr. 2015, pp. 1-14.

* cited by examiner

| | |
|---|---|
| 612A Correct | 616A Correct |
| 612B Threshold number of errors | 616B Correct |
| 612C Threshold number of errors | 616C Correct |
| 612D Correct | 616D Threshold number of errors |

| 612A | 616A |
|------|------|
| 612B | 616B |
| 612C | 616C |
| 612D | 616D |

704

| 612A | 616A |
|------|------|
| 612B | 616B |
| 612C | 616C |
| 612D | 616D |

708

| 612A | 616A |
|------|------|
| 612B | 616B |
| 612C | 616C |
| 612D | 616D |

712

| 612A | 616A |
|------|------|
| 612B | 616B |
| 612C | 616C |
| 612D | 616D |

716

| 612A | 616A |
|------|------|
| 612B | 616B |
| 612C | 616C |
| 612D | 616D |

720

| 612A | 616A |
|------|------|
| 612B | 616B |
| 612C | 616C |
| 612D | 616D |

724

| 612A | 616A |
|------|------|
| 612B | 616B |
| 612C | 616C |
| 612D | 616D |

728

804

716

US 11,507,454 B2

IDENTIFYING NON-CORRECTABLE ERRORS USING ERROR PATTERN ANALYSIS

TECHNICAL FIELD

The present disclosure relates to detecting errors in memory devices. In particular, the present disclosure relates to pattern based identification of non-correctable memory errors in memory devices.

BACKGROUND

Dynamic random access memory (DRAM) is generally constructed from regular arrays of memory cells (e.g., deep trench capacitors), each of which stores a charge state that indicates a single bit of data that is either a "1" or a "0." A single DRAM device (i.e., an electronically packaged integrated circuit die) may include millions or billions of individual cells. The individual cells within each device may be arranged in a hierarchy of blocks of cells.

In some cases, the charge state stored in a memory cell is unintentionally switched from the stored (written) state to an erroneous state that is different from the stored state, thereby unintentionally creating an erroneous bit value in the cell. These so called "soft errors" may be caused by an encounter between a memory cell and a cosmically originating particle, naturally occurring radiation from the decay of materials used in the fabrication of electronic devices, among other causes. A processor in communication with a memory device may execute error correcting code (ECC) algorithms that use metadata stored in a memory device to identify errors in the corresponding stored data. For example, ECC algorithms may identify cells in a memory region that store a bit value different than the bit value originally written to that cell. Some errors are correctable in that various techniques may be used to restore the written value to the memory cell. Other errors are not correctable.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

The embodiments are illustrated by way of example and not by way of limitation in the figures of the accompanying drawings. It should be noted that references to "an" or "one" embodiment in this disclosure are not necessarily to the same embodiment, and they mean at least one. In the drawings:

FIG. 6 illustrates an example region of memory in which individual memory cells are labeled to indicate whether their correspondingly stored bit value deviates from an expected value or is correct in accordance with one or more embodiments;

FIG. 7 illustrates subsets of combinations of individual erroneous memory cells (potential corruption patterns) based on the error pattern of the memory region shown in FIG. 6 in accordance with one or more embodiments;

DETAILED DESCRIPTION

In the following description, for the purposes of explanation, numerous specific details are set forth in order to provide a thorough understanding. One or more embodiments may be practiced without these specific details. Features described in one embodiment may be combined with features described in a different embodiment. In some examples, well-known structures and devices are described with reference to a block diagram form in order to avoid unnecessarily obscuring the present invention.

1. GENERAL OVERVIEW
2. SYSTEM ARCHITECTURE
3. MEMORY DEVICE STRUCTURE AND ERROR CORRECTION CODES
4. PREDICTING NON-CORRECTABLE ERRORS USING ERROR PATTERN ANALYSIS
  4.1 PREDICTING NON-CORRECTABLE ERRORS USING CORRECTABLE CORRUPTION PATTERN COMPARISONS
  4.2 PREDICTING NON-CORRECTABLE ERRORS USING NON-CORRECTABLE CORRUPTION PATTERN COMPARISONS
5. EXAMPLE EMBODIMENT
6. COMPUTER NETWORKS AND CLOUD NETWORKS
7. MISCELLANEOUS; EXTENSIONS
8. HARDWARE OVERVIEW

1. General Overview

One or more embodiments include techniques for identifying patterns of memory cells in a memory array that are associated with a non-correctable error. While traditional techniques use memory cell error count totals or error count rates to identify non-correctable errors, the techniques described herein instead identify patterns of memory cell errors (i.e., groups of one or more memory cells storing bit values that deviate from an expected or written bit value) that are not likely to be correctable (for example, using error correction codes (ECC)) or are correctable but are associated with patterns likely to generate uncorrectable errors in the future. A system first identifies an initial pattern of erroneous memory cells in the memory region. The system generates additional patterns formed by various combinations of cells included in the initial pattern. The initial pattern and additional patterns are collectively referred to as potential corruption patterns. The system compares potential corruption patterns to patterns of cells that are known to be correctable using ECC. If all of the potential corruption patterns (equivalently terms "error patterns") are determined to be correctable using ECC, then no further action need be taken other than executing the ECC to correct the erroneous bits. However, if one or more of the combinations of erroneous cells associated with the corruption pattern are not associated with ECC correctable patterns, then the system determines that the memory array (or region of memory with erroneous cells) meets a vulnerability criteria for data corruption associated with a non-correctable error pattern.

One or more embodiments described in this Specification and/or recited in the claims may not be included in this General Overview section.

2. System Architecture

Figure 1A:
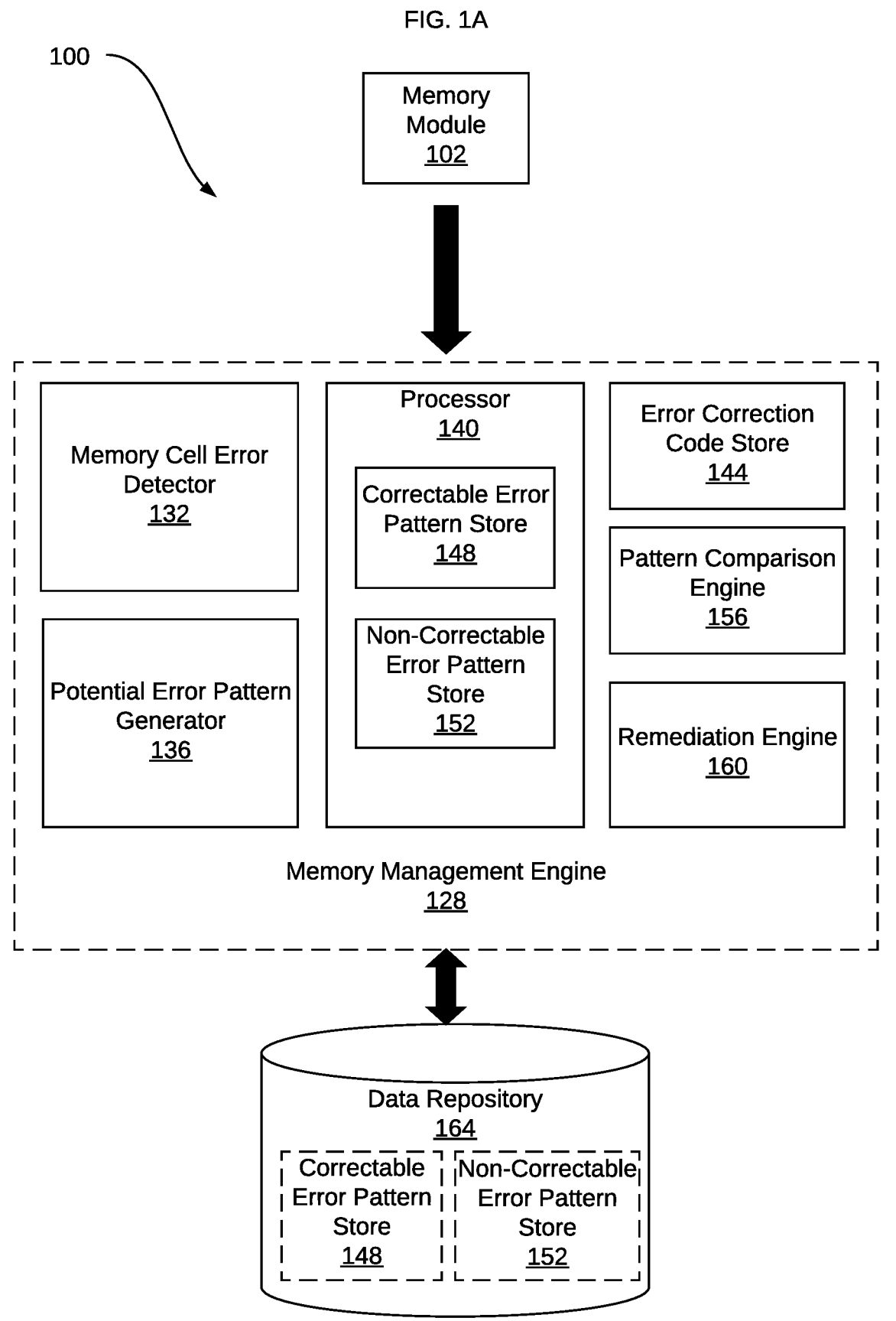
FIG. 1A illustrates a system in accordance with one or more embodiments.

FIG. 1A illustrates a memory management system 100 in accordance with one or more embodiments. In the embodiment shown, the memory management system 100 includes a memory module 102, a memory management engine 128, and a data repository 164. In one or more embodiments, the system 100 may include more components than those illustrated in FIG. 1A. The components illustrated in FIG. 1A may be local to or remote from other components used by the system 100. The components illustrated in FIG. 1A may be implemented in software and/or hardware and may be distributed over one or more applications and/or machines. Operations described with respect to the components illustrated in FIG. 1A may be instead performed by one or more other components.

The memory module 102 may include any type of memory type, whether DRAM, SRAM, or magnetic memory types. The examples described below are presented in the context of DRAM memory, but the embodiments described herein are applicable to any other memory type for which error correction codes may be used. The memory module 102 may include one or more memory regions, which are described below in the context of FIG. 1B. In some examples, the memory module 102 includes multiple, interconnected memory devices. For example, the memory module 102 may include multiple DRAM devices (i.e., electronically packaged DRAM die) mounted on a substrate. Common configurations of memory modules are single in-line memory modules (SIMMs) or dual in-line memory modules (DIMMs). While the memory module 102 is used for the following explanation, it will be appreciated that these techniques are applicable to any size or configuration of memory region, whether a single memory bank (e.g., a region within a DRAM die), an entire DRAM die, some or all of a DRAM SIMM or DIMM, or groups of many SIMMs or DIMMs. The term "region" as used herein is applicable to any of these memory assembly levels.

The memory management engine 128 may identify one or more memory cells in the memory module 102 storing a bit value that deviates from an expected bit value (i.e., an erroneous memory cell). The memory management engine 128 may further determine whether the erroneous cells form a pattern that is correctable using error correction codes (ECC).

The memory management engine 128 includes a memory cell error detector 132, a potential error pattern generator 136, a processor 140, an error correction code store 144, a pattern comparison engine 156, and a remediation engine 160.

The memory cell error detector 132 may detect erroneous memory cells in the memory module 102 using metadata stored in the memory module 102 in conjunction with error correction code stored in the error correction code store 144. Once detected, the memory cell error detector 132 may pass erroneous cell addresses, and/or correct cell addresses, to the potential error pattern generator 136.

The potential error pattern generator 136 generates mathematical combinations of the memory cells in which an error has been detected (using an erroneous cell only once in each combination), thereby generating a plurality of potential error patterns. As described below, the potential error patterns are generated in preparation for comparison to patterns known not to be correctable using ECC. Because memory cells are presumed to operate independently from one another and because memory cells that exhibit a present error are presumed to be more likely to exhibit an error in the future, the generation of these patterns anticipates possible future error patterns.

The processor 140 may communicate with the error correction code store 144, which stores one or more error correction codes. The processor 140 may communicate with the error correction code store 144 and generate, using the stored error correction codes, representations of one or both of the correctable cell patterns and non-correctable cell patterns. In some embodiments, generating representations of one or both of the correctable cell patterns and non-correctable cell patterns can be accomplished by analyzing characteristics associated with the stored error correction codes to efficiently generate approximate representations of one or both of the aforementioned patterns (e.g., using a computationally efficient probabilistic data structure that is searched for patterns using a Bloom filter, for example). While using code characteristics to generate cell patterns is computationally efficient this process may generate correctable or non-correctable error pattern sets which over-represent or under-represent the actual set(s) of correctable and/or non-correctable error patterns. These over or under inclusive sets, when compared to actual error patterns, may result in false positive or false negative analytical results. Therefore, in other embodiments, the processor 140 may communicate with the error correction code store 144 to execute the various ECCs to generate precise maps of some or all of correctable and/or non-correctable error patterns. Regardless of the technique, the processor 140 may compare patterns of memory cells that are correctable and/or patterns of memory cells that are not correctable, as described herein. These generated patterns are stored in the correctable error pattern store 148 and the non-correctable error pattern store 152, respectively.

The stores 148, 152 are memory regions within or in communication with the processor 140. The stores 148, 152 may store their associated patterns, generated according the techniques described herein. While shown as elements of the processor 140, in another embodiment these memory regions may be stored in the data repository 164. The optional additional and/or alternative storage location is represented in FIG. 1 using dashed lines to outline the stores 148, 152 in the data repository 164.

In one or more embodiments, the various stores (e.g., correctable error pattern store 148, non-correctable error pattern store 152, error correction code store 144), and the data repository 164 may be any type of storage unit and/or device (e.g., a file system, database, collection of tables, or any other storage mechanism) for storing data. Further, these stores and the data repository may include multiple different storage units and/or devices. The multiple different storage units and/or devices may or may not be of the same type or located at the same physical site. Further, these stores may be implemented or may execute on the same computing system as the memory management engine 128 and/or the system 100. In another embodiment, the data stores may be implemented or executed on a computing system separate from the memory management engine 128 and/or the system 100. Data stores may be communicatively coupled to the system 100 and/or the memory management engine 128 via a direct connection or via a network.

While not shown in FIG. 1, the data repository may also store potential corruption patterns, executable code for implementing the techniques described herein, among other aspects.

The pattern comparison engine 156 may compare one or both of the patterns stored in the correctable error pattern store 148 and the non-correctable error pattern store 152 to the corresponding (erroneous cell or correct cell) pattern stored in the potential error pattern generator 136.

Detection of non-correctable errors is sent to the remediation engine 160. The remediation engine 160 may send a notification for remedial action to be executed or may initiate remedial action itself.

Information describing techniques for identifying non-correctable errors using error pattern analysis may be implemented across any of components within the system 100. However, FIG. 1 illustrates a memory management engine 128 implementing embodiments of error pattern analysis for purposes of clarity and explanation.

In one or more embodiments, the memory management engine 128 refers to hardware and/or software configured to perform operations described herein for identifying non-correctable errors using error pattern analysis. Examples of operations for identifying non-correctable errors using error pattern analysis are described below with reference to FIG. 2 and FIG. 4.

In an embodiment, the memory management engine 128 is implemented on one or more digital devices. The term "digital device" generally refers to any hardware device that includes a processor. A digital device may refer to a physical device executing an application or a virtual machine. Examples of digital devices include a computer, a tablet, a laptop, a desktop, a netbook, a server, a web server, a network policy server, a proxy server, a generic machine, a function-specific hardware device, a hardware router, a hardware switch, a hardware firewall, a hardware firewall, a hardware network address translator (NAT), a hardware load balancer, a mainframe, a television, a content receiver, a set-top box, a printer, a mobile handset, a smartphone, a personal digital assistant ("PDA"), a wireless receiver and/or transmitter, a base station, a communication management device, a router, a switch, a controller, an access point, and/or a client device.

In one or more embodiments, the memory management engine 128 include one or more interfaces (e.g., generated by the remediation engine 160), whether hardware and/or software that are configured to facilitate communications between a user and the memory management engine 128. Such an interface renders user interface elements and receives input via user interface elements. Examples of interfaces include a graphical user interface (GUI), a command line interface (CLI), a haptic interface, and a voice command interface. Examples of user interface elements include checkboxes, radio buttons, dropdown lists, list boxes, buttons, toggles, text fields, date and time selectors, command lines, sliders, pages, and forms.

In an embodiment, different components of an interface are specified in different languages. The behavior of user interface elements is specified in a dynamic programming language, such as JavaScript. The content of user interface elements is specified in a markup language, such as hypertext markup language (HTML) or XML User Interface Language (XUL). The layout of user interface elements is specified in a style sheet language, such as Cascading Style Sheets (CSS). Alternatively, an interface may be specified in one or more other languages, such as Java, C, or C++.

3. Memory Device Structure and Error Correction Codes

Figure 1B:
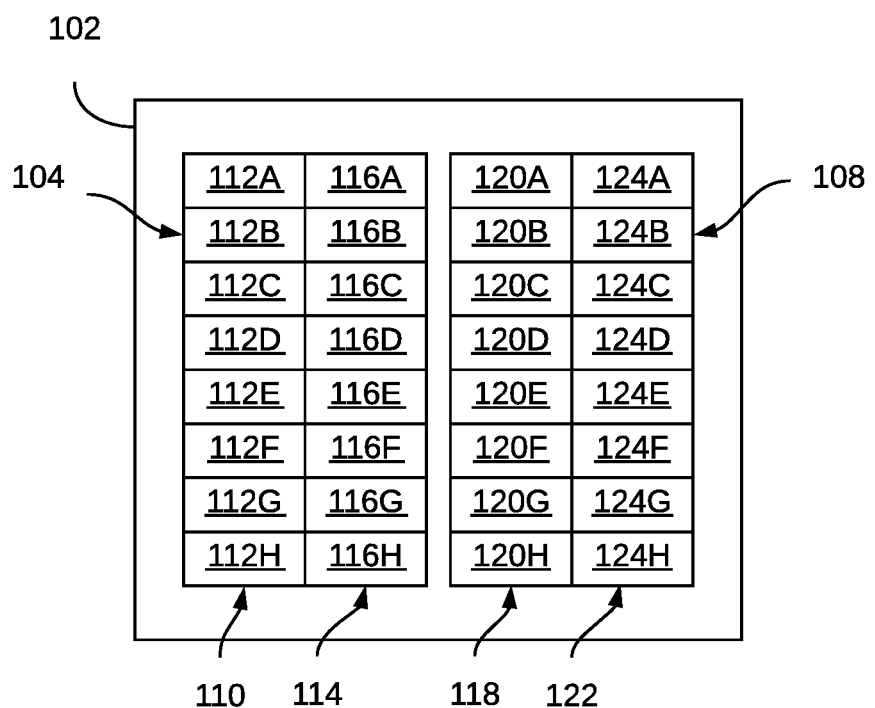
FIG. 1B illustrates an example memory region that includes memory blocks composed of arrays of individual memory cells in accordance with one or more embodiments.

FIG. 1B illustrates a more detailed view of the memory module 102 in accordance with one or more embodiments. As illustrated in FIG. 1B, the memory module 102 is a 32 bit DRAM memory region. The memory module 102 includes two memory blocks 104 and 108 (sometimes equivalently referred to as "memory banks," or "memory regions"). Each of the memory blocks 104, 108 is formed from an array of 16 memory cells. As shown in FIG. 1B, the memory block 104 includes cells 112A-112H arranged in a first column 110 and memory cells 116A-116H arranged in a second column 114. The memory block 108 includes cells 120A-120H arranged in a first column 118 and memory cells 124A-124H arranged in a second column 122. Because each memory cell of the example memory module 102 is capable of storing a single bit (e.g., as a high or low charge state in a capacitor), each of the blocks 104, 108 can store 16 bits.

In some embodiments, each column 110, 114, 118, 122 is associated with a corresponding input/output (I/O) pin of the electronically packaged DRAM device (not shown) of which the memory module 102 is a component. In some embodiments, each row of memory cells (e.g., 112A, 116A, 120A, 124A) may be read and/or written to during a single clock cycle of the computer system in which the memory module 102 is a component.

Memory regions and devices may have a hierarchical organization in which a size of a memory block is based on the number of rows and the number of columns of memory cells in the memory block. The rows and columns of a block are generally accessible by bit lines (reading and writing to columns of memory cells) and word lines (reading and writing to rows of memory cells). A memory region may be formed from multiple blocks that are accessible via buses or other interconnections fabricated between the blocks.

In one or more embodiments, the memory module 102 may include more or fewer components than the components illustrated in FIG. 1B, which is provided for convenience and clarity of explanation. For example, a single DRAM die (i.e., a patterned and functional silicon chip) may have millions, billions or trillions of individual memory cells.

The techniques described herein refer to the use of error correction codes (ECC) to determine whether patterns of cells in which one or more errors are detected are correctable or not correctable. Error correction codes are algorithms that may use metadata, for example, stored with bit values to determine whether a bit value stored in a memory cell (e.g., a high or low charge state in a DRAM capacitor) is an expected value. Bit values stored in a cell that are not expected or are otherwise not consistent with the value predicted by the ECC are identified as errors. In some examples, execution of ECC may correct an erroneous bit value in a cell and restore it to the expected (i.e., written) value.

The extent to which errors may be corrected by ECC may vary depending on the algorithm itself (e.g., Golay, Multi-dimensional parity, Hamming), the microprocessor used in the computing system, among other factors. In some cases, certain types of error patterns are commonly correctable by many different ECC algorithms. For example, many different ECC algorithms are designed to correct erroneous bit values in cells associated with a common I/O pin. In the context of the example shown in FIG. 1B, an example error pattern associated with a common I/O pin would include one or more erroneous cells in cell column 110 (or equivalently errors exclusively in any one of columns 114, 118, or 122). Many other patterns of errors are correctable upon execution of an ECC algorithm.

Techniques of the present disclosure use ECC to generate patterns known to be correctable and then compare patterns formed from combinations of the erroneous cells in the memory region to these known correctable patterns. If any error patterns (i.e., groups of one or more memory cells storing bit values that deviate from an expected or written bit value) exhibited in a region of memory (or any subset thereof) are dissimilar from the correctable error patterns, the system identifies the memory region as vulnerable. In some examples, an error pattern may be correctable but include one or more cells that are associated with non-correctable errors. In response, the system may generate a notification recommending remedial action or may directly execute a remedial action.

Using error pattern analysis to identify collections of memory cells vulnerable to producing non-correctable memory cell error patterns, as described herein, has a number of benefits compared to traditional techniques for identifying vulnerable memory regions. In part, traditional techniques may incorrectly identify some memory regions as vulnerable to a permanent memory fault ("false positive") and also incorrectly identify some memory regions as not vulnerable to a permanent memory fault ("false negative"). The false positive and false negative error identification may be generated by traditional techniques that rely on simple error count schemes to identify vulnerable memory regions. For example, if a particular region has a number of errors exceeding a threshold count, then the system identifies the particular region as vulnerable to a permanent memory fault. A traditional error counting scheme may thus generate a false positive if the high error count is associated with a pattern that is correctable using ECC. Similarly, a traditional error counting scheme may generate a false negative result if a memory region that is not correctable using ECC generates errors that do not exceed the threshold.

4. Predicting Non-Correctable Errors Using Error Pattern Analysis

Two examples of techniques for identifying non-correctable errors in a memory region are described below. The first technique (described in Section 4.1) compares a pattern of errors in the memory region and the various combinations of erroneous cells in the pattern to patterns of memory cells that are known to be correctable upon application of ECC. If the memory region corruption pattern or any of the combinations of cells in the pattern (generated by the system as part of the techniques herein) deviate from the known correctable patterns, the system presumes that the memory region is vulnerable to producing a non-correctable error in the future. The second technique (described in Section 4.2) applies an inverse of the first technique. The system compares the pattern of errors in the memory region (i.e., the set of potential corruption patterns) and the various combinations of erroneous cells in the pattern (generated by the system) to error patterns known to be non-correctable based on an analysis of the ECC. If the memory region error pattern or any of its system-generated combinations match any of the known non-correctable error patterns, the system presumes that the memory region is vulnerable to producing a non-correctable error in the future.

Figure 2:
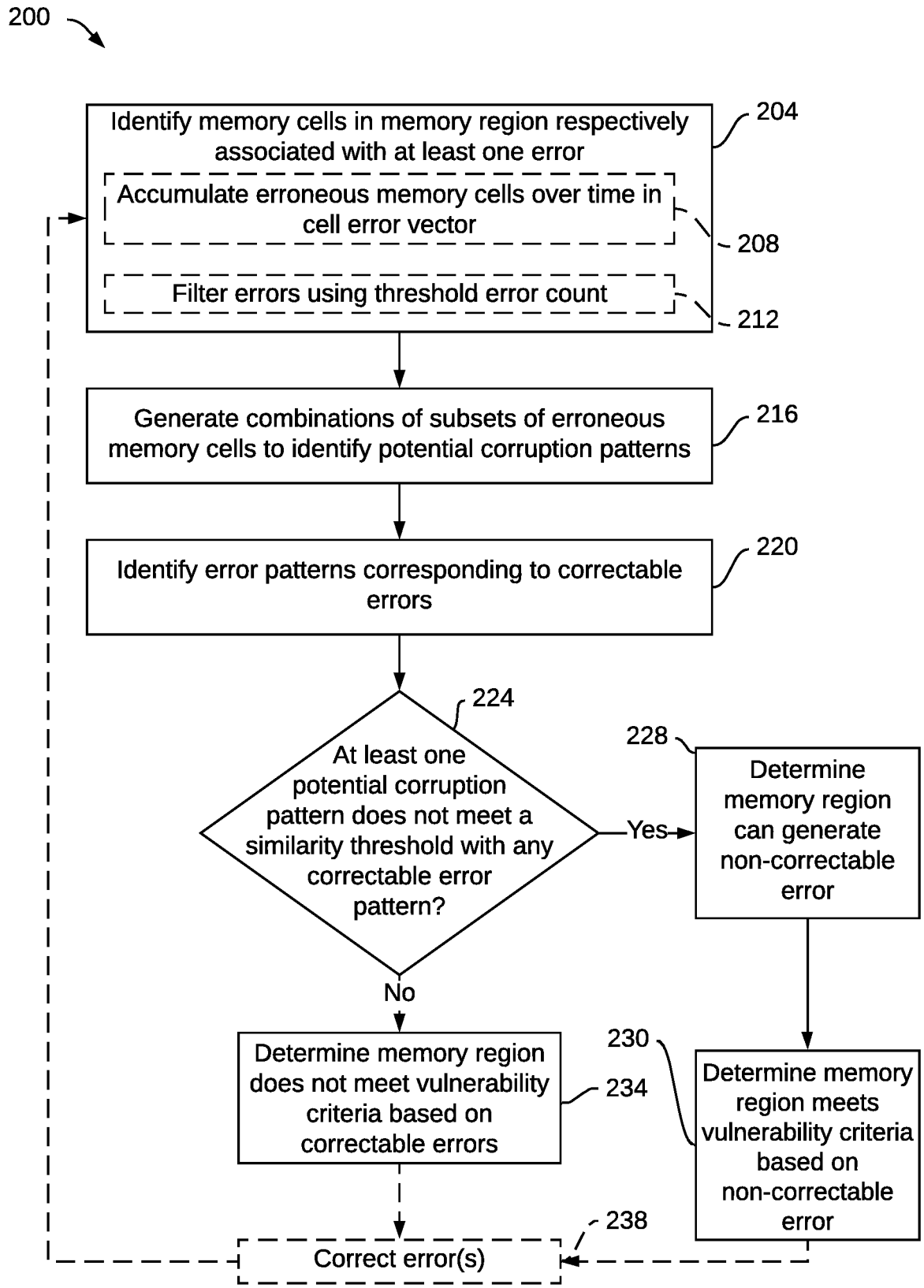
FIG. 2 illustrates an example set of operations for detecting non-correctable memory errors by comparing subsets of erroneous memory cells to patterns of correctable memory errors in accordance with one or more embodiments.

4.1 Predicting Non-Correctable Errors Using Correctable Corruption Pattern Comparisons FIG. 2 illustrates an example set of operations as a method 200 for identifying memory regions that include non-correctable errors and may require remediation, in accordance with one or more embodiments. One or more operations illustrated in FIG. 2 may be modified, rearranged, or omitted all together. Accordingly, the particular sequence of operations illustrated in FIG. 2 should not be construed as limiting the scope of one or more embodiments.

The method 200 may begin by the system identifying memory cells in a memory region that are associated with at least one error (operation 204). The system may identify a memory region that includes at least one error using ECC to determine whether a bit value (e.g., a low or high charge state of a capacitor in a DRAM device) associated with a particular memory cell in the memory region matches an expected value. If a stored bit value is different from an expected bit value for a particular memory cell, the system identifies the particular memory cell as storing an incorrect bit value (i.e., associating the cell with an error). The system may analyze the cells in a particular region of memory, thereby identifying a pattern of memory cells in the region storing bit values, some of which store correct bit values and others of which store erroneous bit values.

A pattern of correct and/or erroneous bit values corresponding to a memory region may correspond to an "instantaneous" pattern generated as a snapshot at the time that the operation 204 is executed. The pattern may be used to generate an error vector to represent the erroneous cells. In some examples, the system may execute the operation 204 repeatedly over a period of time and accumulate (or "aggregate") the patterns of correct and erroneous memory cells in the memory region (operation 208). A system may generate an error vector with the erroneous memory cells accumulated over time. The error vector may accumulate memory cell identifiers associated with an error over time by joining the sets (e.g., using an "OR" operation) of erroneous cells produced by repeated execution of the operation 204. In other examples, errors are accumulated in one or more error vectors (e.g., each error vector associated with a region or set of memory cells, or a single region at or within a particular detection time). In various examples, an error vector is a representation of every memory cell associated with an error during a measurement period. The error vectors may then be joined to form a joined error vector. In some examples, the joined set may be referred to as a "superset." Similarly, the joined error vectors may be used to generate a superset of potential corruption patterns. The superset may then be analyzed to determine a similarity with correctable or non-correctable error patterns, as described herein.

The preceding embodiment of the error vector may associate an error with a cell upon detecting an erroneous bit value once. Using a single error occurrence in a cell to identify an error assumes that memory cells exhibiting an error at one point in time are more likely to exhibit an error in the future. Other embodiments of error vectors may also operate on an additional assumption that some errors are random events (e.g., from cosmic particles) that may not necessarily predict a future failure of the cell. Assuming a random-event error model may mean that some example error vectors may accumulate errors using a filter that does not identify a memory cell as erroneous until a minimum threshold number of errors have been identified for the cell (operation 212). In one embodiment, a total number of errors may be accumulated toward the threshold during a measurement period. In another embodiment, errors may be accumulated and simultaneously decremented during the measurement period using a removal rate per unit time (e.g., a "leaky bucket" counter).

In some examples, error vectors associated with separate memory regions may be stored separately in a table of error vectors. The entries (e.g., corresponding to the separate memory regions and/or corresponding error vectors) in the error vector table may be identified with a unique identifier. This enables the system to access any stored error vectors associated with a particular memory region.

Regardless of the error accounting technique used, once the system identifies memory cells in the memory region as erroneous, the system then generates a plurality of subsets of the cells associated with an error. In some embodiments, each subset is a different combination of erroneous memory cells (or their corresponding identifiers) (operation 216). These different combinations describe potential corruption patterns. That is, because cells are assumed to operate independently of one another, any combination of cells associated with an error is identified as a possible future corruption pattern even if the identified corruption pattern itself is correctable. In some embodiments, each of the different combinations of erroneous memory cells may be represented as one or more error vectors. The representation of error patterns and potential corruption patterns as error vectors facilitates similarity analyses, as described below. The subsets of different combinations of erroneous memory cells may include sets that consist of individual cells or groups of cells. In one example, a subset includes all of the erroneous memory cells.

The system then identifies patterns of erroneous memory cells that are known to be correctable via the ECC algorithm used by the system (operation 220). These techniques are described above in the context of FIG. 1.

The system then compares the various potential corruption patterns to the patterns of correctable memory cells generated via the ECC algorithm to determine if at least one potential corruption pattern does not meet a similarity threshold with any correctable error pattern (operation 224). The system may perform the comparison by executing a similarity comparison (e.g., cosine similarity) between vector representations of each potential corruption pattern (e.g., using the corresponding error vectors) and vector representations of each correctable error pattern.

If at least one potential corruption pattern does not meet a similarity threshold with any of the correctable error patterns (operation 224), then the memory region is determined to be capable of generating a non-correctable error (operation 228). The vulnerability threshold is met and remedial action beyond executing ECC may be recommended (operation 230). The system may optionally correct any errors that are capable of being corrected (operation 238).

However, if the patterns do meet a similarity threshold with correctable error patters (operation 224), then the errors are determined to be correctable (operation 234) and may optionally be corrected by applying ECC (operation 238). In other words, if the set of potential corruption patterns forms a subset of the set of correctable patterns, then the errors are presumed correctable. The vulnerability threshold is not met and the errors may be corrected using ECC (operation 232). The system may optionally continue monitoring errors by resuming the method 200 at the operation 204.

In some examples the remedial action consumes resources that are more significant than simply executing ECC. Examples of remedial actions include reassigning data to a different memory region, replicating a region of memory in a different memory region or different memory device, or even physically replacing a memory region (e.g., a DIMM or SIMM). All of these remedial actions consume computing and/or financial resources, and some of the remedial actions may only be deployed a fixed number of times before more significant action is taken. The improved accuracy of the techniques described herein improve the operation of a computing device by avoiding use of remedial actions when not actually needed.

Figure 3:
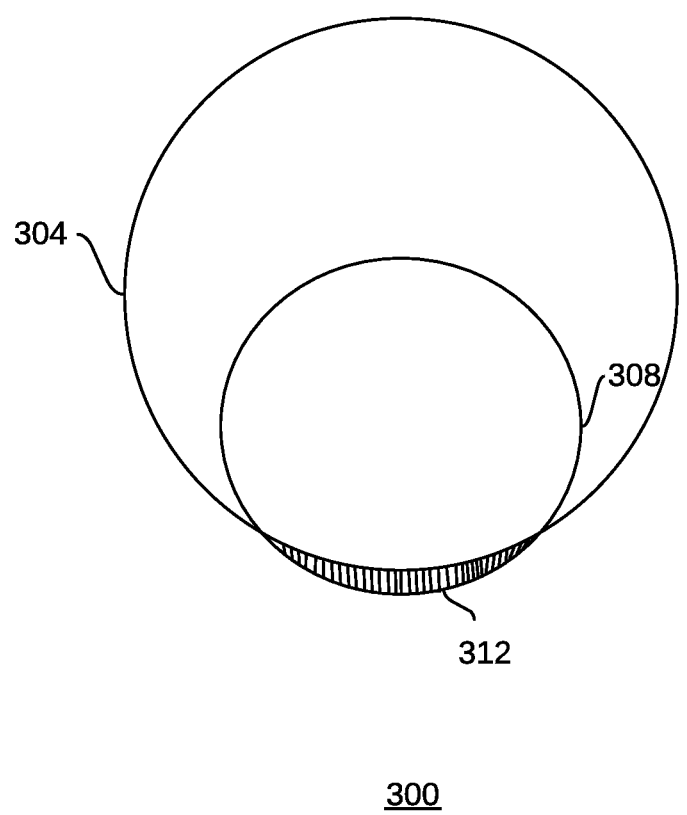
FIG. 3 illustrates a relationship between a set of combinations of potential corruption patterns and a set of correctable error patterns that satisfies a vulnerability criteria for the memory region in accordance with one or more embodiments.

FIG. 3 is a Venn diagram 300 that graphically illustrates a relationship between a set of correctable corruption patterns 304 and a set of potential corruption patterns 308. As shown, the set of correctable corruption patterns 304 encompasses most, but not all, of the set of potential corruption patterns 308. Instead, a portion of the set of potential corruption patterns 308 (indicated by shading) lies outside of the set of correctable corruption patterns 304. The shaded portion indicates a subset of potential corruption patterns 312 that does not meet a similarity criteria with any of the set of correctable corruption patterns 304. The portion representing the subset 312 in the diagram 300 has been exaggerated for clarity. In some examples, only a single potential corruption pattern (or even a single memory cell in a single potential corruption pattern) need be dissimilar from the set of correctable corruption patterns 304 to exceed a vulnerability criteria.

Figure 4:
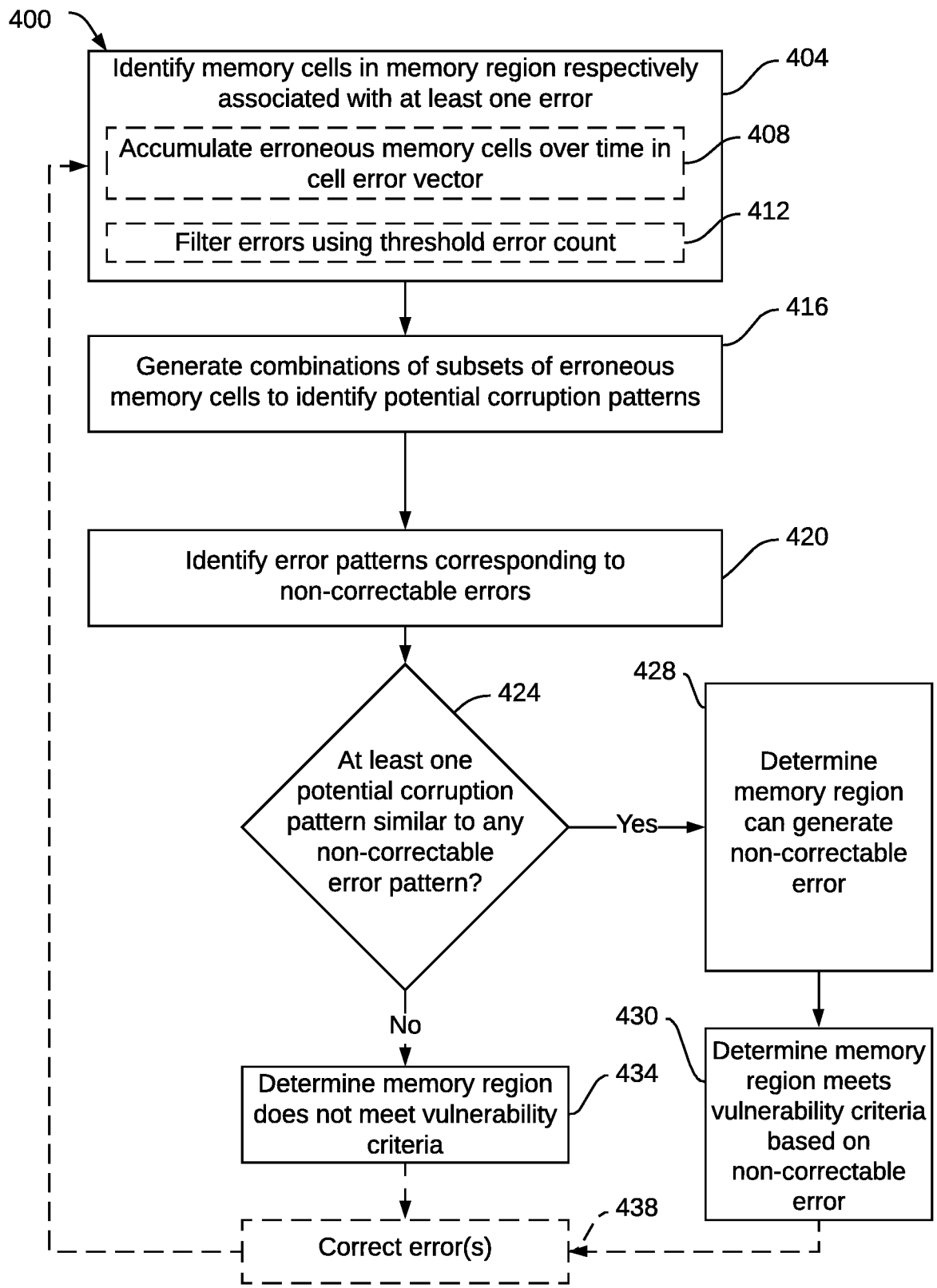
FIG. 4 illustrates an example set of operations for detecting non-correctable memory errors by comparing subsets of erroneous memory cells to patterns of non-correctable memory errors in accordance with one or more embodiments.

4.2 Predicting Non-Correctable Errors Using Non-Correctable Corruption Pattern Comparisons FIG. 4 illustrates a method 400 that is analogous the method 200 shown in FIG. 2, with the difference that in the method 400 a vulnerability criteria is met upon a potential corruption meeting a similarity criteria with an error pattern corresponding to non-correctable errors.

The method 400 begins with operations similar to those used by the method 200. The system identifies memory cells in a memory region that are associated with at least one error (operation 404). The system may identify the erroneous memory cells using ECC to determine whether a bit value (e.g., a low or high charge state of a capacitor in a DRAM device) associated with a particular memory cell in the memory region matches an expected value. If a stored bit value is different from an expected bit value for a particular memory cell, the system identifies the particular memory cell as storing an incorrect bit value (i.e., associating the cell with an error). The system may erroneous cells in a particular region of memory, thereby identifying a pattern of memory cells in the region storing bit values some of which store correct bit values and others of which store erroneous bit values.

As with the method 200, the method 400 may also accumulate erroneous memory cells over time into an error vector (operation 408) and/or filter errors using a threshold error count and/or a decrementing rate (operation 412). These techniques are described above in the context of the operations 408 and 412.

Regardless of the error accounting technique used, once the system identifies memory cells in the memory region as erroneous, the system then generates a plurality of subsets of the cells associated with an error to identify potential corruption patterns (operation 416). In some embodiments, each subset is a different combination of the erroneous memory cells (or their corresponding cell identifiers). As above, the system generates these potential corruption patterns based on an assumption that any cell associated with an error during a measurement period is more likely to be associated with another error in the future. Upon assuming current erroneous cells may be associated with future errors, each of the potential corruption patterns thus represents a combination of cells that may generate future errors. In some embodiments, each of the different combinations of erroneous memory cells may be represented as an error vector to facilitate execution of the similarity analysis.

The system then identifies patterns of erroneous memory cells that are known to be non-correctable via the ECC algorithm used by the system (operation 420). The techniques for the operation 420 are analogous to those described above in the context of operation 220.

The system them compares the various potential corruption patterns to the patterns of non-correctable memory cells generated via the ECC algorithm (operation 424). The system may perform the comparison of the operation 424 by executing a similarity comparison (e.g., cosine similarity) between vector representations of each potential corruption pattern (i.e., error vectors of each potential corruption pattern) and vector representations of each correctable error pattern.

If at least one potential corruption pattern meets a similarity threshold with any of the non-correctable error patterns (operation 424), then the memory region is determined to be capable of generating non-correctable errors (operation 428). Based on the operation 428, the system determines that a vulnerability criteria is met (operation 430). The system may optionally identify the non-correctable error and/or recommend remedial action. The system may optionally correct any errors that are capable of being corrected (operation 438).

Alternatively, if no potential corruption patterns are similar to non-correctable error patterns, the system determines the memory region does not meet the vulnerability criteria (operation 434). The errors may optionally be corrected using ECC (operation 438) and the system may resume monitoring (operation 404)

Figure 5:
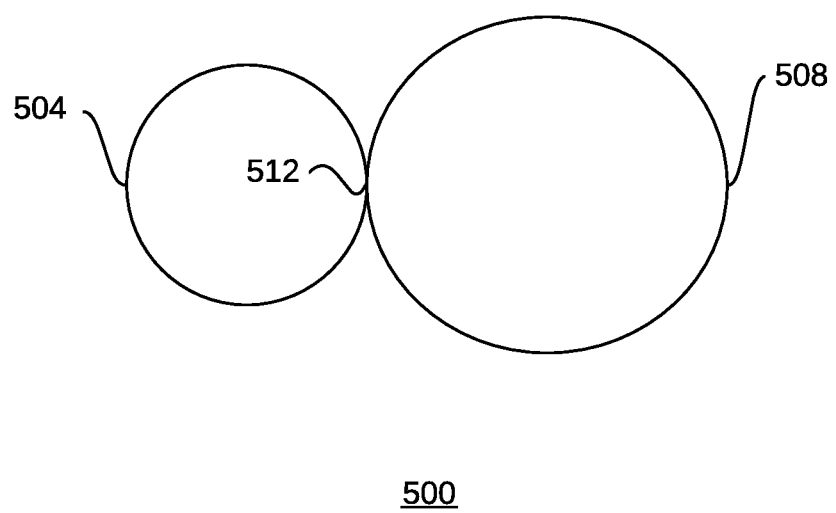
FIG. 5 illustrates the minimum overlap between the set of combinations of potential corruption patterns and the set of non-correctable error patterns needed to satisfy a vulnerability criteria for the memory region in accordance with one or more embodiments.

FIG. 5 is a Venn diagram 500 that graphically illustrates an example relationship between a set of non-correctable corruption patterns 504 and a set of potential corruption patterns 508. As shown, the non-correctable corruption patterns 504 may be tangent with the set of potential corruption patterns 508. The point of tangency 512 indicates that only a single potential corruption patterns 508 needs to meet a similarity criteria with the set of non-correctable corruption patterns 504 to meet a vulnerability criteria. A single point of tangency 512 between the patterns 504 and 508 represents the minimum condition for meeting the vulnerability criteria.

5. Example Embodiment

A detailed example is described below for purposes of clarity. Components and/or operations described below should be understood as one specific example which may not be applicable to certain embodiments. Accordingly, components and/or operations described below should not be construed as limiting the scope of any of the claims.

FIGS. 6, 7, 8A, and 8B illustrate various stages of the techniques described above in the context of a specific memory region.

FIG. 6 illustrates a memory region 604 that includes memory cells 612A, 612B, 612C, 612D in a first column 610 and memory cells 616A, 616B, 616C, 616D in a second column 614. The memory region 604 may be a portion of a larger memory array. The limited size of the memory region 604 is presented in FIG. 6 for convenience and clarity of explanation.

Each of the memory cells 612A-612D, 616A-616D is labeled with a corresponding error status 628. Memory cells 612A, 612D, 616A, 616B, and 616C each store a bit that matches a corresponding bit value checked using an ECC algorithm executed by a computing device (e.g., a processor) in communication with the memory region 604.

Memory cells 612B, 612C, and 616D are labeled with an error status 628 that indicates that the bit values stored in these cells deviates from the expected bit value. The error status 628 for these memory cells is "threshold number of errors" to reflect the optional use of filters and/or thresholds described above. That is, in some embodiments, the memory cells 612B, 612C, and 616D are not associated with an error until a minimum number of deviations from an expected bit value are detected within a measurement period. Once identified as associated with an erroneous bit value, the collection of the memory cells 612B, 612C, and 616D constitute a first corruption pattern.

FIG. 7 illustrates a plurality of the different combinations of the erroneous cells shown in FIG. 6. That is, FIG. 7 illustrates potential corruption patterns 704, 708, 712, 716, 720, 724, 728 each of which is a subset of the erroneous cells shown in FIG. 6. Potential corruption patterns 704, 708, and 712 each illustrate a potential corruption pattern with only one of the erroneous cells 612B, 612C, and 616D. Potential corruption patterns 716, 720, and 724 include the potential corruption patterns that are each subsets of two of the erroneous cells. Potential corruption pattern 728 is the subset of all three erroneous cells.

As explained above, each of the potential corruption patterns 704, 708, 712, 716, 720, 724, and 728 is generated based on the assumption that any memory cell currently storing an erroneous bit value is likely to generate errors in the future.

Figure 8A:
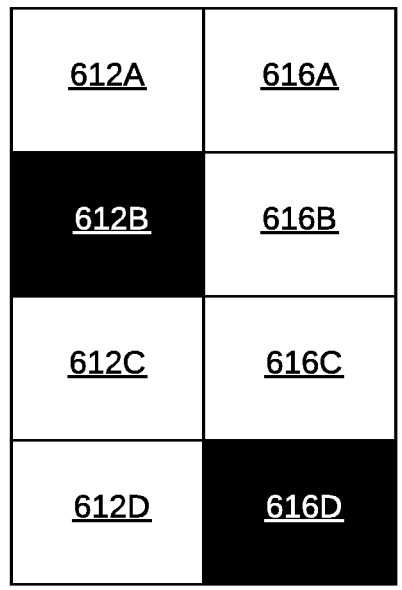
FIG. 8A illustrates a non-correctable error pattern associated with the memory region shown in FIG. 6 as determined by an analysis of corresponding error correction code.

FIG. 8A illustrates a non-correctable corruption pattern 804 as determined according to an analysis of an error correction code associated with the memory region 604. The non-correctable corruption pattern 804 is characterized by errors present in both of memory cells 612B and 626D.

Figure 8B:
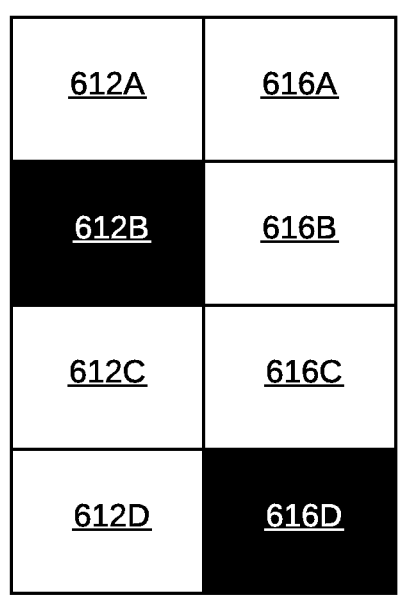
FIG. 8B illustrates a subset of the potential error patterns illustrated in FIG. 7 that meet a similarity criteria with the non-correctable error pattern shown in FIG. 8A in accordance with one or more embodiments.

FIG. 8B illustrates the one potential corruption patterns associated with the different combinations of the erroneous cells in FIG. 6 that matches the non-correctable error pattern 804. Namely, potential corruption pattern 716 includes the same cells, 612B and 616D, that are present in the non-correctable corruption pattern 804. Because the potential corruption pattern 716 matches the non-correctable error pattern 804 (or more generally, meets a similarity criteria with the non-correctable error pattern 804), the memory region 604 meets a vulnerability criteria. The system may then take remedial action or generate a notification recommending remedial action.

6. Computer Networks and Cloud Networks

In one or more embodiments, a computer network provides connectivity among a set of nodes. The nodes may be local to and/or remote from each other. The nodes are connected by a set of links. Examples of links include a coaxial cable, an unshielded twisted cable, a copper cable, an optical fiber, and a virtual link.

A subset of nodes implements the computer network. Examples of such nodes include a switch, a router, a firewall, and a network address translator (NAT). Another subset of nodes uses the computer network. Such nodes (also referred to as "hosts") may execute a client process and/or a server process. A client process makes a request for a computing service (such as, execution of a particular application, and/or storage of a particular amount of data). A server process responds by executing the requested service and/or returning corresponding data.

A computer network may be a physical network, including physical nodes connected by physical links. A physical node is any digital device. A physical node may be a function-specific hardware device, such as a hardware switch, a hardware router, a hardware firewall, and a hardware NAT. Additionally or alternatively, a physical node may be a generic machine that is configured to execute various virtual machines and/or applications performing respective functions. A physical link is a physical medium connecting two or more physical nodes. Examples of links include a coaxial cable, an unshielded twisted cable, a copper cable, and an optical fiber.

A computer network may be an overlay network. An overlay network is a logical network implemented on top of another network (such as, a physical network). Each node in an overlay network corresponds to a respective node in the underlying network. Hence, each node in an overlay network is associated with both an overlay address (to address to the overlay node) and an underlay address (to address the underlay node that implements the overlay node). An overlay node may be a digital device and/or a software process (such as, a virtual machine, an application instance, or a thread) A link that connects overlay nodes is implemented as a tunnel through the underlying network. The overlay nodes at either end of the tunnel treat the underlying multi-hop path between them as a single logical link. Tunneling is performed through encapsulation and decapsulation.

In an embodiment, a client may be local to and/or remote from a computer network. The client may access the computer network over other computer networks, such as a private network or the Internet. The client may communicate requests to the computer network using a communications protocol, such as Hypertext Transfer Protocol (HTTP). The requests are communicated through an interface, such as a client interface (such as a web browser), a program interface, or an application programming interface (API).

In an embodiment, a computer network provides connectivity between clients and network resources. Network resources include hardware and/or software configured to execute server processes. Examples of network resources include a processor, a data storage, a virtual machine, a container, and/or a software application. Network resources are shared amongst multiple clients. Clients request computing services from a computer network independently of each other. Network resources are dynamically assigned to the requests and/or clients on an on-demand basis. Network resources assigned to each request and/or client may be scaled up or down based on, for example, (a) the computing services requested by a particular client, (b) the aggregated computing services requested by a particular tenant, and/or (c) the aggregated computing services requested of the computer network. Such a computer network may be referred to as a "cloud network."

In an embodiment, a service provider provides a cloud network to one or more end users. Various service models may be implemented by the cloud network, including but not limited to Software-as-a-Service (SaaS), Platform-as-a-Service (PaaS), and Infrastructure-as-a-Service (IaaS). In SaaS, a service provider provides end users the capability to use the service provider's applications, which are executing on the network resources. In PaaS, the service provider provides end users the capability to deploy custom applications onto the network resources. The custom applications may be created using programming languages, libraries, services, and tools supported by the service provider. In IaaS, the service provider provides end users the capability to provision processing, storage, networks, and other fundamental computing resources provided by the network resources. Any arbitrary applications, including an operating system, may be deployed on the network resources.

In an embodiment, various deployment models may be implemented by a computer network, including but not limited to a private cloud, a public cloud, and a hybrid cloud. In a private cloud, network resources are provisioned for exclusive use by a particular group of one or more entities (the term "entity" as used herein refers to a corporation, organization, person, or other entity). The network resources may be local to and/or remote from the premises of the particular group of entities. In a public cloud, cloud resources are provisioned for multiple entities that are independent from each other (also referred to as "tenants" or "customers"). The computer network and the network resources thereof are accessed by clients corresponding to different tenants. Such a computer network may be referred to as a "multi-tenant computer network." Several tenants may use a same particular network resource at different times and/or at the same time. The network resources may be local to and/or remote from the premises of the tenants. In a hybrid cloud, a computer network comprises a private cloud and a public cloud. An interface between the private cloud and the public cloud allows for data and application portability. Data stored at the private cloud and data stored at the public cloud may be exchanged through the interface. Applications implemented at the private cloud and applications implemented at the public cloud may have dependencies on each other. A call from an application at the private cloud to an application at the public cloud (and vice versa) may be executed through the interface.

In an embodiment, tenants of a multi-tenant computer network are independent of each other. For example, a business or operation of one tenant may be separate from a business or operation of another tenant. Different tenants may demand different network requirements for the computer network. Examples of network requirements include processing speed, amount of data storage, security requirements, performance requirements, throughput requirements, latency requirements, resiliency requirements, Quality of Service (QoS) requirements, tenant isolation, and/or consistency. The same computer network may need to implement different network requirements demanded by different tenants.

In one or more embodiments, in a multi-tenant computer network, tenant isolation is implemented to ensure that the applications and/or data of different tenants are not shared with each other. Various tenant isolation approaches may be used.

In an embodiment, each tenant is associated with a tenant ID. Each network resource of the multi-tenant computer network is tagged with a tenant ID. A tenant is permitted access to a particular network resource only if the tenant and the particular network resources are associated with a same tenant ID.

In an embodiment, each tenant is associated with a tenant ID. Each application, implemented by the computer network, is tagged with a tenant ID. Additionally or alternatively, each data structure and/or dataset, stored by the computer network, is tagged with a tenant ID. A tenant is permitted access to a particular application, data structure, and/or dataset only if the tenant and the particular application, data structure, and/or dataset are associated with a same tenant ID.

As an example, each database implemented by a multi-tenant computer network may be tagged with a tenant ID. Only a tenant associated with the corresponding tenant ID may access data of a particular database. As another example, each entry in a database implemented by a multi-tenant computer network may be tagged with a tenant ID. Only a tenant associated with the corresponding tenant ID may access data of a particular entry. However, the database may be shared by multiple tenants.

In an embodiment, a subscription list indicates which tenants have authorization to access which applications. For each application, a list of tenant IDs of tenants authorized to access the application is stored. A tenant is permitted access to a particular application only if the tenant ID of the tenant is included in the subscription list corresponding to the particular application.

In an embodiment, network resources (such as digital devices, virtual machines, application instances, and threads) corresponding to different tenants are isolated to tenant-specific overlay networks maintained by the multi-tenant computer network. As an example, packets from any source device in a tenant overlay network may only be transmitted to other devices within the same tenant overlay network. Encapsulation tunnels are used to prohibit any transmissions from a source device on a tenant overlay network to devices in other tenant overlay networks. Specifically, the packets, received from the source device, are encapsulated within an outer packet. The outer packet is transmitted from a first encapsulation tunnel endpoint (in communication with the source device in the tenant overlay network) to a second encapsulation tunnel endpoint (in communication with the destination device in the tenant overlay network). The second encapsulation tunnel endpoint decapsulates the outer packet to obtain the original packet transmitted by the source device. The original packet is transmitted from the second encapsulation tunnel endpoint to the destination device in the same particular overlay network.

7. Miscellaneous; Extensions

Embodiments are directed to a system with one or more devices that include a hardware processor and that are configured to perform any of the operations described herein and/or recited in any of the claims below.

In an embodiment, a non-transitory computer readable storage medium comprises instructions which, when executed by one or more hardware processors, causes performance of any of the operations described herein and/or recited in any of the claims.

Any combination of the features and functionalities described herein may be used in accordance with one or more embodiments. In the foregoing specification, embodiments have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

8. Hardware Overview

According to one embodiment, the techniques described herein are implemented by one or more special-purpose computing devices. The special-purpose computing devices may be hard-wired to perform the techniques, or may include digital electronic devices such as one or more application-specific integrated circuits (ASICs), field programmable gate arrays (FPGAs), or network processing units (NPUs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, FPGAs, or NPUs with custom programming to accomplish the techniques. The special-purpose computing devices may be desktop computer systems, portable computer systems, handheld devices, networking devices or any other device that incorporates hard-wired and/or program logic to implement the techniques.

Figure 9:
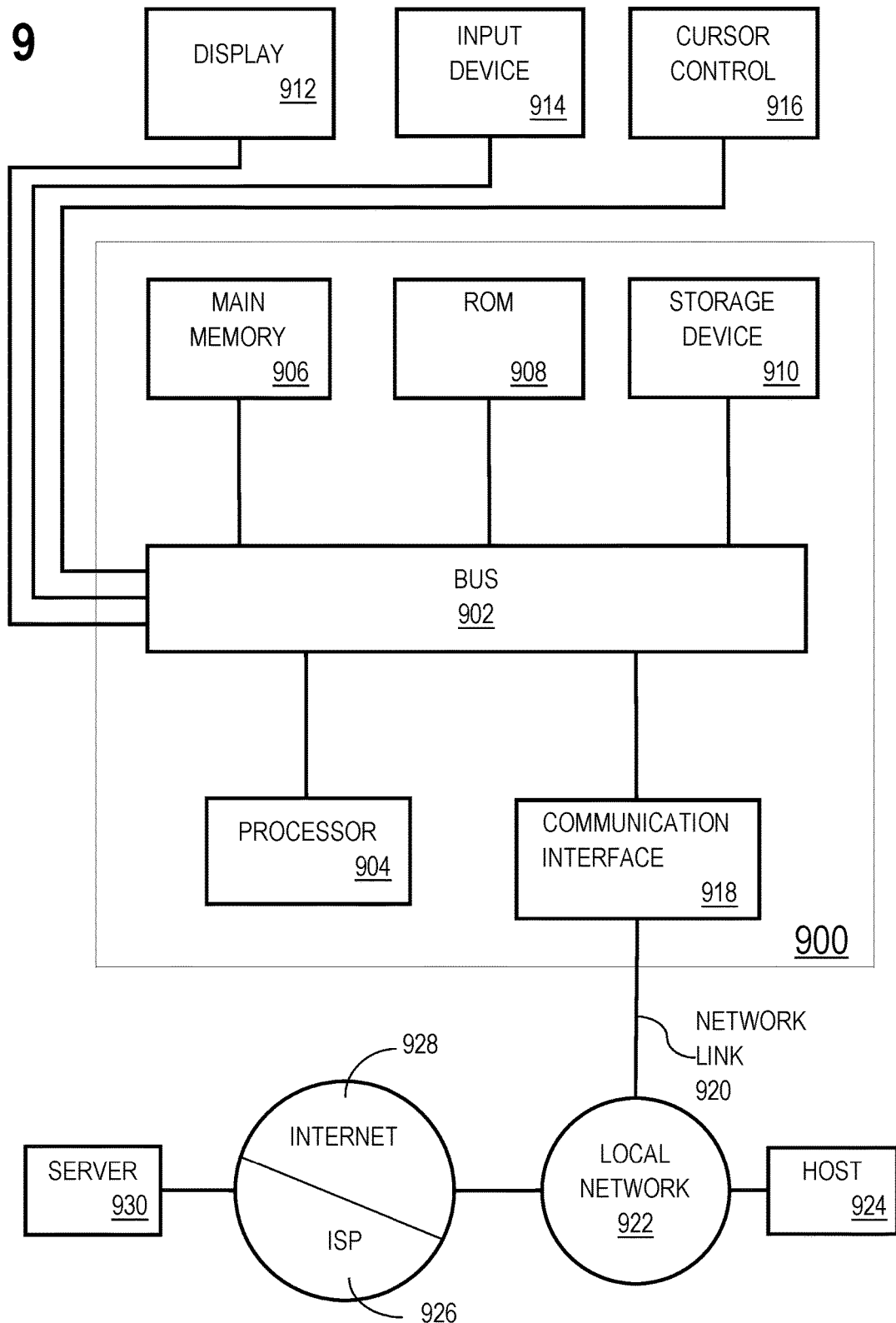
FIG. 9 shows a block diagram that illustrates a computer system in accordance with one or more embodiments.

For example, FIG. 9 is a block diagram that illustrates a computer system 900 upon which an embodiment of the invention may be implemented. Computer system 900 includes a bus 902 or other communication mechanism for communicating information, and a hardware processor 904 coupled with bus 902 for processing information. Hardware processor 904 may be, for example, a general purpose microprocessor.

Computer system 900 also includes a main memory 906, such as a random access memory (RAM) or other dynamic storage device, coupled to bus 902 for storing information and instructions to be executed by processor 904. Main memory 906 also may be used for storing temporary variables or other intermediate information during execution of instructions to be executed by processor 904. Such instructions, when stored in non-transitory storage media accessible to processor 904, render computer system 900 into a special-purpose machine that is customized to perform the operations specified in the instructions.

Computer system 900 further includes a read only memory (ROM) 908 or other static storage device coupled to bus 902 for storing static information and instructions for processor 904. A storage device 910, such as a magnetic disk or optical disk, is provided and coupled to bus 902 for storing information and instructions.

Computer system 900 may be coupled via bus 902 to a display 912, such as a cathode ray tube (CRT), for displaying information to a computer user. An input device 914, including alphanumeric and other keys, is coupled to bus 902 for communicating information and command selections to processor 904. Another type of user input device is cursor control 916, such as a mouse, a trackball, or cursor direction keys for communicating direction information and command selections to processor 904 and for controlling cursor movement on display 912. This input device typically has two degrees of freedom in two axes, a first axis (e.g., x) and a second axis (e.g., y), that allows the device to specify positions in a plane.

Computer system 900 may implement the techniques described herein using customized hard-wired logic, one or more ASICs or FPGAs, firmware and/or program logic which in combination with the computer system causes or programs computer system 900 to be a special-purpose machine. According to one embodiment, the techniques herein are performed by computer system 900 in response to processor 904 executing one or more sequences of one or more instructions contained in main memory 906. Such instructions may be read into main memory 906 from another storage medium, such as storage device 910. Execution of the sequences of instructions contained in main memory 906 causes processor 904 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical or magnetic disks, such as storage device 910. Volatile media includes dynamic memory, such as main memory 906. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, content-addressable memory (CAM), and ternary content-addressable memory (TCAM).

Storage media is distinct from but may be used in conjunction with transmission media. Transmission media participates in transferring information between storage media. For example, transmission media includes coaxial cables, copper wire and fiber optics, including the wires that comprise bus 902. Transmission media can also take the form of acoustic or light waves, such as those generated during radio-wave and infra-red data communications.

Various forms of media may be involved in carrying one or more sequences of one or more instructions to processor 904 for execution. For example, the instructions may initially be carried on a magnetic disk or solid state drive of a remote computer. The remote computer can load the instructions into its dynamic memory and send the instructions over a telephone line using a modem. A modem local to computer system 900 can receive the data on the telephone line and use an infra-red transmitter to convert the data to an infra-red signal. An infra-red detector can receive the data carried in the infra-red signal and appropriate circuitry can place the data on bus 902. Bus 902 carries the data to main memory 906, from which processor 904 retrieves and executes the instructions. The instructions received by main memory 906 may optionally be stored on storage device 910 either before or after execution by processor 904.

Computer system 900 also includes a communication interface 918 coupled to bus 902. Communication interface 918 provides a two-way data communication coupling to a network link 920 that is connected to a local network 922. For example, communication interface 918 may be an integrated services digital network (ISDN) card, cable modem, satellite modem, or a modem to provide a data communication connection to a corresponding type of telephone line. As another example, communication interface 918 may be a local area network (LAN) card to provide a data communication connection to a compatible LAN. Wireless links may also be implemented. In any such implementation, communication interface 918 sends and receives electrical, electromagnetic or optical signals that carry digital data streams representing various types of information.

Network link 920 typically provides data communication through one or more networks to other data devices. For example, network link 920 may provide a connection through local network 922 to a host computer 924 or to data equipment operated by an Internet Service Provider (ISP) 926. ISP 926 in turn provides data communication services through the worldwide packet data communication network now commonly referred to as the "Internet" 928. Local network 922 and Internet 928 both use electrical, electromagnetic or optical signals that carry digital data streams. The signals through the various networks and the signals on network link 920 and through communication interface 918, which carry the digital data to and from computer system 900, are example forms of transmission media.

Computer system 900 can send messages and receive data, including program code, through the network(s), network link 920 and communication interface 918. In the Internet example, a server 930 might transmit a requested code for an application program through Internet 928, ISP 926, local network 922 and communication interface 918.

The received code may be executed by processor 904 as it is received, and/or stored in storage device 910, or other non-volatile storage for later execution.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

What is claimed is:

1. One or more non-transitory computer-readable media storing instructions, which when executed by one or more hardware processors, cause performance of operations comprising:

identifying, by reading values stored in a memory, a first plurality of one or more memory cells in a region of the memory that are respectively associated with at least one error;

generating a plurality of combinations corresponding to subsets of the first plurality of one or more memory cells as a first plurality of potential corruption patterns;

identifying a plurality of correctable corruption patterns corresponding to correctable errors associated with the memory cells of the region of the memory;

determining that at least one potential corruption pattern of the first plurality of potential corruption patterns does not meet a similarity criteria with any of the plurality of correctable corruption patterns; and responsive to the determining operation:
determining that the region of the memory meets a vulnerability criteria for data corruption associated with a non-correctable error pattern.

2. The media of claim 1, wherein the operations further comprise:
identifying a second plurality of one or more memory cells stored in the region of the memory that are respectively associated with at least one error;
generating a plurality of combinations corresponding to subsets of the second plurality of one or more memory cells as a second plurality of potential corruption patterns;
joining the first plurality of potential corruption patterns and the second plurality of potential corruption patterns to form a superset of potential corruption patterns;
determining that at least one potential corruption pattern of the plurality of the superset of potential corruption patterns does not meet the similarity criteria with any of the plurality of correctable corruption patterns; and
responsive to the determining operation:
determining that the region of the memory meets the vulnerability criteria for data corruption associated with the non-correctable corruption pattern.

3. The media of claim 1, further comprising establishing a minimum threshold of errors corresponding to memory cells of the first plurality of one or more memory cells wherein a cell is identified as a member of the first plurality of one or more memory cells associated with at least one error upon exceeding the minimum threshold.

4. The media of claim 1, wherein the first plurality of one or more memory cells is identified by:
identifying the first plurality of one or more memory cells in the region of the memory associated with respective errors during a period of time;
aggregating each of the memory cells of the first plurality of one or more memory cells identified during the period of time;
generating an error vector corresponding to the first plurality of one or more memory cells and an indication of the error; and
storing the error vector in an error vector table indexed by addresses corresponding to cells associated with the memory cells in the region of the memory.

5. The media of claim 4, wherein the operations further comprise:
identifying a second plurality of one or more memory cells stored in the region of the memory that are respectively associated with at least one error;
generating an additional error vector corresponding to the second plurality of one or more memory cells and an indication of the error;
joining the error vector corresponding to the first plurality of one or more memory cells with the additional error vector corresponding to the second plurality of one or more memory cells to form a joined error vector;
generating, using the joined error vector, a superset of potential corruption patterns;
determining that at least one potential corruption pattern of the plurality of the superset of potential corruption patterns does not meet the similarity criteria with any of the plurality of correctable corruption patterns; and
responsive to the determining operation:
determining that the region of the memory meets the vulnerability criteria for data corruption associated with the non-correctable corruption pattern.

6. The media of claim 4, wherein the operation determining that at least one potential corruption pattern does not meet the similarity criteria comprises:
generating vectors corresponding to the patterns of the plurality of correctable corruption patterns; and
executing a vector comparison comparing the error vector corresponding to the memory cells of the first plurality of one or more memory cells to the vectors corresponding to the plurality of the correctable corruption patterns.

7. The media of claim 1, further comprising:
applying a minimum error threshold to the memory cells of the first plurality of one or more memory cells;
measuring a number of errors for individual memory cells of the first plurality of one or more memory cells; and
wherein associating the memory cells of the first plurality of one or more memory cells with at least one error comprises associating the error with a particular memory cell upon the number of errors for the particular memory cell exceeding the minimum error threshold.

8. The media of claim 7, further comprising:
defining a measurement period during which the number of errors for individual memory cells of the first plurality of one or more memory cells are measured;
identifying an error time associated with the identification of the errors associated with the first plurality of one or more memory cells; and
defining a threshold period of time within the measurement period, after which errors associated with the first plurality of one or more memory cells are removed.

9. One or more non-transitory computer-readable media storing instructions, which when executed by one or more hardware processors, cause performance of operations comprising:
identifying, by reading values stored in a memory, a first plurality of one or more memory cells in a region of the memory that are respectively associated with at least one error;
generating a plurality of combinations corresponding to subsets of the first plurality of one or more memory cells as a first plurality of potential corruption patterns;
identifying a plurality of non-correctable corruption patterns corresponding to non-correctable errors associated with the memory cells of the region of the memory;
determining that at least one potential corruption pattern of the first plurality of potential corruption patterns meets a similarity criteria with any of the plurality of non-correctable corruption patterns; and
responsive to the determining operation:
determining that the region of the memory meets a vulnerability criteria for data corruption associated with a non-correctable corruption pattern.

10. The media of claim 9, wherein the operations further comprise:
identifying a second plurality of one or more memory cells stored in the region of the memory that are respectively associated with at least one error;
generating a plurality of combinations corresponding to subsets of the second plurality of one or more memory cells as a second plurality of potential corruption patterns;

joining the first plurality of potential corruption patterns and the second plurality of potential corruption patterns to form a superset of potential corruption patterns;

determining that at least one potential corruption pattern of the plurality of the superset of potential corruption patterns meets the similarity criteria with any of the plurality of non-correctable corruption patterns; and responsive to the determining operation:

determining that the region of the memory meets the vulnerability criteria for data corruption associated with a non-correctable error pattern.

11. The media of claim 9, further comprising establishing a minimum threshold of errors corresponding to memory cells of the first plurality of one or more memory cells wherein a cell is identified as a member of the first plurality of one or more memory cells associated with at least one error upon exceeding the minimum threshold.

12. The media of claim 9, wherein the first plurality of one or more memory cells is identified by:

identifying the first plurality of one or more memory cells in the region of the memory associated with respective errors during a period of time;

aggregating each of the memory cells of the first plurality of one or more memory cells identified during the period of time; and generating an error vector corresponding to the first plurality of one or more memory cells and an indication of the error; and storing the error vector in an error vector table indexed by addresses corresponding to cells associated with the memory cells in the region of the memory.

13. The media of claim 12, wherein the operations further comprise:

identifying a second plurality of one or more memory cells stored in the region of the memory that are respectively associated with at least one error;

generating an additional error vector corresponding to the second plurality of one or more memory cells and an indication of the error;

joining the error vector corresponding to the first plurality of one or more memory cells with the additional error vector corresponding to the second plurality of one or more memory cells to form a joined error vector;

generating, using the joined error vector, a superset of potential corruption patterns;

determining that at least one potential corruption pattern of the plurality of the superset of potential corruption patterns does meet the similarity criteria with any of the plurality of correctable corruption patterns; and responsive to the determining operation:

determining that the region of the memory meets the vulnerability criteria for data corruption associated with the non-correctable corruption pattern.

14. The media of claim 12, wherein the operation determining that at least one potential corruption pattern meets the similarity criteria comprises:

generating vectors corresponding to the patterns of the plurality of non-correctable corruption patterns; and executing a vector comparison comparing the error vector corresponding to the memory cells of the first plurality of one or more memory cells to the vectors corresponding to the plurality of the non-correctable corruption patterns.

15. The media of claim 9, further comprising:

applying a minimum error threshold to the memory cells of the first plurality of one or more memory cells;

measuring a number of errors for individual memory cells of the first plurality of one or more memory cells; and wherein associating the memory cells of the first plurality of one or more memory cells with at least one error comprises associating the error with a particular memory cell upon the number of errors for the particular memory cell exceeding the minimum error threshold.

16. The media of claim 15, further comprising:

defining a measurement period during which the number of errors for individual memory cells of the first plurality of one or more memory cells are measured;

identifying an error time associated with the identification of the errors associated with the first plurality of one or more memory cells; and defining a threshold period of time within the measurement period, after which errors associated with the first plurality of one or more memory cells are removed.

17. A system comprising:

at least one device including a hardware processor;

the system being configured to perform operations comprising:

identifying, by reading values stored in a memory, a first plurality of one or more memory cells in a region of the memory that are respectively associated with at least one error;

generating a plurality of combinations corresponding to subsets of the first plurality of one or more memory cells as a first plurality of potential corruption patterns;

identifying a plurality of correctable corruption patterns corresponding to correctable errors associated with the memory cells of the region of the memory;

determining that at least one potential corruption pattern of the first plurality of potential corruption patterns does not meet a similarity criteria with any of the plurality of correctable corruption patterns; and responsive to the determining operation:

determining that the region of the memory meets a vulnerability criteria for data corruption associated with a non-correctable error pattern.

18. The system of claim 17, wherein the operations further comprise:

identifying a second plurality of one or more memory cells stored in the region of the memory that are respectively associated with at least one error;

generating a plurality of combinations corresponding to subsets of the second plurality of one or more memory cells as a second plurality of potential corruption patterns;

joining the first plurality of potential corruption patterns and the second plurality of potential corruption patterns to form a superset of potential corruption patterns;

determining that at least one potential corruption pattern of the plurality of the superset of potential corruption patterns does not meet a similarity criteria with any of the plurality of correctable corruption patterns; and responsive to the determining operation:

determining that the region of the memory meets a vulnerability criteria for data corruption associated with a non-correctable error pattern.

19. The system of claim 17, further comprising establishing a minimum threshold of errors corresponding to memory cells of the first plurality of one or more memory cells wherein a cell is identified as a member of the first plurality of one or more memory cells associated with at least one error upon exceeding the minimum threshold.

20. The system of claim 17, wherein the first plurality of one or more memory cells is identified by:
  identifying the first plurality of one or more memory cells in the region of the memory associated with respective errors during a period of time;
  aggregating each of the memory cells of the first plurality of one or more memory cells identified during the period of time; and
  generating an error vector corresponding to the first plurality of one or more memory cells and an indication of the error; and
  storing the error vector in an error vector table indexed by addresses corresponding to cells associated with the memory cells in the region of the memory.

21. The system of claim 20, wherein the operations further comprise:
  identifying a second plurality of one or more memory cells stored in the region of the memory that are respectively associated with at least one error;
  generating an additional error vector corresponding to the second plurality of one or more memory cells and an indication of the error;
  joining the error vector corresponding to the first plurality of one or more memory cells with the additional error vector corresponding to the second plurality of one or more memory cells to form a joined error vector;
  generating, using the joined error vector, a superset of potential corruption patterns;
  determining that at least one potential corruption pattern of the plurality of the superset of potential corruption patterns does not meet the similarity criteria with any of the plurality of correctable corruption patterns; and
  responsive to the determining operation:
    determining that the region of the memory meets the vulnerability criteria for data corruption associated with the non-correctable error pattern.

22. The system of claim 20, wherein the operation determining that at least one potential corruption pattern does not meet the similarity criteria comprises:
  generating vectors corresponding to the patterns of the plurality of correctable corruption patterns; and
  executing a vector comparison comparing the error vector of the first plurality of one or more memory cells to the vectors corresponding to the plurality of the correctable corruption patterns.

23. The system of claim 17, further comprising:
  applying a minimum error threshold to the memory cells of the first plurality of one or more memory cells;
  measuring a number of errors for individual memory cells of the first plurality of one or more memory cells; and
  wherein associating the memory cells of the first plurality of one or more memory cells with at least one error comprises associating the error with a particular memory cell upon the number of errors for the particular memory cell exceeding the minimum error threshold.

24. A method comprising:
  identifying, by reading values stored in a memory, a first plurality of one or more memory cells in a region of the memory that are respectively associated with at least one error;
  generating a plurality of combinations corresponding to subsets of the first plurality of one or more memory cells as a first plurality of potential corruption patterns;
  identifying a plurality of correctable corruption patterns corresponding to correctable errors associated with the memory cells of the region of the memory;
  determining that at least one potential corruption pattern of the first plurality of potential corruption patterns does not meet a similarity criteria with any of the plurality of correctable corruption patterns; and
  responsive to the determining operation:
    determining that the region of the memory meets a vulnerability criteria for data corruption associated with a non-correctable error pattern.

25. A method comprising:
  identifying, by reading values stored in a memory, a first plurality of one or more memory cells in a region of the memory that are respectively associated with at least one error;
  generating a plurality of combinations corresponding to subsets of the first plurality of one or more memory cells as a first plurality of potential corruption patterns;
  identifying a plurality of non-correctable corruption patterns corresponding to non-correctable errors associated with the memory cells of the region of the memory;
  determining that at least one potential corruption pattern of the first plurality of potential corruption patterns meets a similarity criteria with any of the plurality of non-correctable corruption patterns; and
  responsive to the determining operation:
    determining that the region of the memory meets a vulnerability criteria for data corruption associated with a non-correctable corruption pattern.

* * * * *